United States Patent
Nielsen et al.

(10) Patent No.: US 12,308,859 B2
(45) Date of Patent: May 20, 2025

(54) SYSTEMS AND METHODS FOR ASYNCHRONOUS DATA COMMUNICATION IN NOISY ENVIRONMENTS

(71) Applicant: Acceleware Ltd., Calgary (CA)

(72) Inventors: Jorgen S. Nielsen, Calgary (CA); Michal M. Okoniewski, Calgary (CA)

(73) Assignee: Acceleware Ltd., Calgary (CA)

( * ) Notice: Subject to any disclaimer, the term of this patent is extended or adjusted under 35 U.S.C. 154(b) by 19 days.

(21) Appl. No.: 18/510,803

(22) Filed: Nov. 16, 2023

(65) Prior Publication Data

US 2024/0154621 A1 May 9, 2024

Related U.S. Application Data

(63) Continuation of application No. PCT/CA2022/050679, filed on May 3, 2022.

(60) Provisional application No. 63/189,894, filed on May 18, 2021, provisional application No. 63/239,473, filed on Sep. 1, 2021.

(51) Int. Cl.
*H03M 3/00* (2006.01)
*H03M 1/12* (2006.01)
*H04L 7/00* (2006.01)
*H04L 27/01* (2006.01)

(52) U.S. Cl.
CPC .............. *H03M 3/404* (2013.01); *H03M 1/12* (2013.01); *H04L 7/0029* (2013.01); *H04L 27/01* (2013.01)

(58) Field of Classification Search
CPC .......... H03M 3/404; H03M 1/12; H03M 3/00; H04L 7/0029; H04L 27/01
See application file for complete search history.

(56) References Cited

U.S. PATENT DOCUMENTS

| | | | |
|---|---|---|---|
| 5,309,484 A | 5/1994 | Mclane et al. | |
| 8,942,281 B2* | 1/2015 | Daecke | H04L 25/03878 375/232 |
| 2018/0019862 A1 | 1/2018 | Kliewer et al. | |

OTHER PUBLICATIONS

International Search Report and Written Opinion mailed Jul. 15, 2022 in International Patent Application No. PCT/CA2022/050679 (7 pages).

(Continued)

*Primary Examiner* — Joseph J Lauture
(74) *Attorney, Agent, or Firm* — SMART & BIGGAR LP; Isis E. Caulder; Sunil R. Rao

(57) ABSTRACT

Systems and methods for asynchronous data communication are disclosed. The system includes one or more peripheral devices, a processing device, and one or more communication channels. Each peripheral device includes a peripheral clock and a quantizer. The processing device is remotely located from each peripheral device and includes a processor clock that is asynchronous with at least one peripheral clock, an analog continuous time filter, and an analog-to-digital converter. The analog continuous time filter filters one or more quantized signals generated by the one or more peripheral devices to generate one or more filtered signals. The analog continuous time filter has a filter bandwidth corresponding to a signal bandwidth of one or more analog time varying signals represented by the one or more quantized signals. The analog-to-digital converter generates one or more converted signals by sampling the one or more filtered signals based on a processor clock signal.

20 Claims, 10 Drawing Sheets

(56) References Cited

OTHER PUBLICATIONS

Rodrigues Mansano, "Radio frequency energy harvesting and low power data transmission for autonomous wireless sensor nodes", Doctoral Thesis, TU Delft Bio-Electronics, NL, Nov. 22, 2016 (Nov. 22, 2016), pp. 1-128 (128 pages).
Extended European Search Report dated Sep. 5, 2024 in European Patent Application No. 22803490.6 (10 pages).

* cited by examiner

SYSTEMS AND METHODS FOR ASYNCHRONOUS DATA COMMUNICATION IN NOISY ENVIRONMENTS

CROSS-REFERENCE TO RELATED APPLICATIONS

This application is a continuation of International Application No. PCT/CA2022/050679 filed May 3, 2023, which claims priority from U.S. Provisional Patent Application No. 63/189,894 filed May 18, 2021 and U.S. Provisional Patent Application No. 63/239,473 filed Sep. 1, 2021, the entire contents of which are hereby incorporated by reference for all purposes.

FIELD

The embodiments described herein generally relate to data communication, and in particular, to asynchronous data communication in noisy environments.

BACKGROUND

The following is not an admission that anything discussed below is part of the prior art or part of the common general knowledge of a person skilled in the art.

Data communication between independent devices can involve the synchronization of independent clocks. Such synchronization can be challenging when the devices are physically separated over long distances. Furthermore, even after initially synchronization, each clock may count time at different rates, resulting in drift. Typical clock recovery techniques to resynchronize the clocks can be complex to implement and not very robust. For example, clock recovery can require long acquisition times, and cycle slips, or loss of lock condition can nevertheless occur. The challenge of clock synchronization is further complicated when multiple devices attempt to transmit data simultaneously to a common receiver.

In addition, various environments are subject to electromagnetic interference or noise. For example, in hydrocarbon formations, the application of electromagnetic energy is sometimes used to heat hydrocarbons. Electromagnetic energy can disturb or otherwise interfere with electromagnetic signals used for data communication. More specifically, electromagnetic interference can degrade or introduce noise to electromagnetic signals. As a result, data transmission and reception can be challenging to execute in noisy environments, such as in hydrocarbon formations.

SUMMARY

The following introduction is provided to introduce the reader to the more detailed discussion to follow. The introduction is not intended to limit or define any claimed or as yet unclaimed invention. One or more inventions may reside in any combination or sub-combination of the elements or process steps disclosed in any part of this document including its claims and figures.

In accordance with a broad aspect, there is provided a system for asynchronous communication in noisy environments. The system includes: one or more peripheral devices, a processing device, and one or more communication channels. Each peripheral device includes: a peripheral clock and a quantizer. The peripheral clock generates a peripheral clock signal. The quantizer generates a quantized signal representing an analog time varying signal at the peripheral device by sampling the analog time varying signal based on the peripheral clock signal. The quantized signal includes at least two discrete amplitude levels. The processing device is remotely located from each peripheral device. The processing device includes: a processor clock, an analog continuous time filter, and an analog-to-digital converter. The processor clock generates a processor clock signal. The processor clock signal is asynchronous with at least one peripheral clock signal. The analog continuous time filter filters one or more quantized signals generated by the one or more peripheral devices to generate one or more filtered signals. The analog continuous time filter has a filter bandwidth corresponding to a signal bandwidth of one or more analog time varying signals represented by the one or more quantized signals. The analog-to-digital converter generates one or more converted signals by sampling the one or more filtered signals based on the processor clock signal. Each converted signal represents an interpolation of one of the one or more analog time varying signals that is synchronized with the processor clock signal. The one or more communication channels transport the one or more quantized signals from the one or more peripheral devices to the processing device. Each communication channel is coupled between at least one peripheral device of the one or more peripheral devices and the processing device.

In some embodiments, the filter bandwidth of the analog continuous time filter can be less than the frequency of each peripheral clock signal.

In some embodiments, the frequency of each peripheral clock signal can be greater than the frequency of the processor clock signal.

In some embodiments, the frequency of the processor clock signal can be greater than or equal to the filter bandwidth of the analog continuous time filter.

In some embodiments, the filter bandwidth of the analog continuous time filter can be greater than or equal to the Nyquist rate of the one or more quantized signals.

In some embodiments, the frequency of the peripheral clock signal can be greater than the signal bandwidth of the one or more analog time varying signals.

In some embodiments, the one or more peripheral devices can include a plurality of peripheral devices and each peripheral clock of each peripheral device can generate a peripheral clock signal that is asynchronous with the processor clock signal.

In some embodiments, each peripheral clock of each peripheral device can be asynchronous with each other peripheral clock signal.

In some embodiments, each peripheral device can include a sensor for generating the analog time varying signal. The analog time varying signal can represent one or more environmental conditions measured by the sensor.

In some embodiments, the processing device can include a processor for processing the one or more converted signals based on the processor clock signal to evaluate the one or more environmental conditions.

In some embodiments, the quantizer can be a delta sigma modulator.

In some embodiments, the quantized signal can have two discrete amplitude levels.

In some embodiments, the frequency of each peripheral clock signal can be greater than the Nyquist rate of the analog time varying data signal.

In some embodiments, the one or more communication channels can include at least one of: (i) one or more optical communication channels, (ii) one or more coaxial transmission lines, or (iii) one or more wireless communication channels.

In some embodiments, the analog continuous time filter can include at least one of: (i) a low pass filter, or (ii) a bandpass filter.

In some embodiments, the processing device can include a digital discrete time filter for filtering the one or more filtered signals.

In some embodiments, the processing device can be separated from each peripheral device by at least one kilometer.

In some embodiments, each peripheral device can be located underground and the processing device can be located aboveground.

In accordance with a broad aspect, there is provided a method for asynchronous communication in noisy environments between one or more peripheral devices and a processing device remotely located from each peripheral device. The method involves: generating, by a quantizer of each peripheral device, a quantized signal representing an analog time varying signal at that peripheral device by sampling the analog time varying signal based on a peripheral clock signal of that peripheral device, the quantized signal including at least two discrete amplitude levels; transmitting one or more quantized signals from the one or more peripheral devices to the processing device through one or more communication channels, each communication channel coupled between at least one peripheral device of the one or more peripheral devices and the processing device; filtering, by an analog continuous time filter of the processing device, the one or more quantized signals to generate one or more filtered signals, the analog continuous time filter having a filter bandwidth corresponding to a signal bandwidth of one or more analog time varying signals represented by the one or more quantized signals; and generating, by an analog-to-digital converter of the processing device, one or more converted signals by sampling the one or more filtered signals based on a processor clock signal of the processing device, each converted signal representing an interpolation of one of the one or more analog time varying signals that is synchronized with the processor clock signal, the processor clock signal being asynchronous with at least one peripheral clock signal.

In some embodiments, the filter bandwidth of the analog continuous time filter can be less than the frequency of each peripheral clock signal.

In some embodiments, the frequency of each peripheral clock signal can be greater than the frequency of the processor clock signal.

In some embodiments, the frequency of the processor clock signal can be greater than or equal to the filter bandwidth of the analog continuous time filter.

In some embodiments, the filter bandwidth of the analog continuous time filter can be greater than or equal to the Nyquist rate of the one or more quantized signals.

In some embodiments, the frequency of the peripheral clock signal can be greater than the signal bandwidth of the one or more analog time varying signals.

In some embodiments, the one or more peripheral devices can include a plurality of peripheral devices and each peripheral device can have a peripheral clock signal that is asynchronous with the processor clock signal.

In some embodiments, each peripheral clock of each peripheral device can be asynchronous with each other peripheral clock signal.

In some embodiments, the method can involve generating, at a sensor of each peripheral device, the analog time varying signal, the analog time varying signal representing one or more environmental conditions measured by the sensor.

In some embodiments, the method can involve processing, at a processor of the processing device, the one or more converted signals based on the processor clock signal to evaluate the one or more environmental conditions.

In some embodiments, the quantizer can be a delta sigma modulator.

In some embodiments, the quantized signal can have two discrete amplitude levels.

In some embodiments, the frequency of each peripheral clock signal can be greater than the Nyquist rate of the analog time varying data signal.

In some embodiments, the one or more communication channels can include at least one of: (i) one or more optical communication channels, (ii) one or more coaxial transmission lines, or (iii) one or more wireless communication channels.

In some embodiments, the analog continuous time filter can include at least one of: (i) a low pass filter, or (ii) a bandpass filter.

In some embodiments, the method can involve filtering, by a digital discrete time filter of the processing device, the one or more filtered signals.

In some embodiments, the processing device can be separated from each peripheral device by at least one kilometer.

In some embodiments, each peripheral device can be located underground and the processing device can be located aboveground.

In accordance with a broad aspect, there is provided a non-transitory computer readable medium having instructions stored thereon executable by at least one processor to implement the method.

BRIEF DESCRIPTION OF THE DRAWINGS

Several embodiments will be described in detail with reference to the drawings, in which.

Figure 1A:
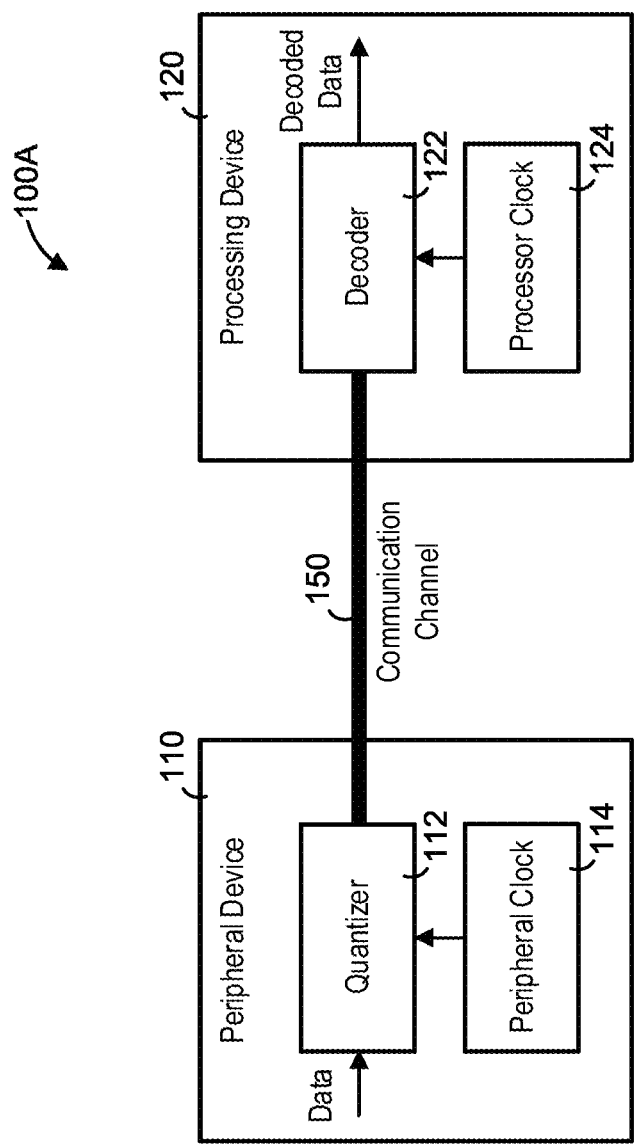
FIG. 1A is a block diagram of an example system for synchronous data communication.

The drawings, described below, are provided for purposes of illustration, and not of limitation, of the aspects and features of various examples of embodiments described herein. For simplicity and clarity of illustration, elements shown in the drawings have not necessarily been drawn to scale. The dimensions of some of the elements may be exaggerated relative to other elements for clarity. It will be appreciated that for simplicity and clarity of illustration, where considered appropriate, reference numerals may be repeated among the drawings to indicate corresponding or analogous elements or steps.

DESCRIPTION OF EXAMPLE EMBODIMENTS

Various systems or methods will be described below to provide an example of an embodiment of the claimed subject matter. No embodiment described below limits any claimed subject matter and any claimed subject matter may cover methods or systems that differ from those described below. The claimed subject matter is not limited to systems or methods having all of the features of any one system or method described below or to features common to multiple or all of the apparatuses or methods described below. It is possible that a system or method described below is not an embodiment that is recited in any claimed subject matter. Any subject matter disclosed in a system or method described below that is not claimed in this document may be the subject matter of another protective instrument, for example, a continuing patent application, and the applicants, inventors or owners do not intend to abandon, disclaim or dedicate to the public any such subject matter by its disclosure in this document.

Referring to FIG. 1A, there is shown an example system 100A for synchronous data communication. As shown, the communication system 100A includes a peripheral device 110 and a processing device 120. The peripheral device 110 is positioned remote from the processing device 120 so that the peripheral device 110 is physically separated from the processing device 120. In some examples, the peripheral device 110 and the processing device 120 can be separated by one or more kilometers. As well, the peripheral device 110 can be underground while the processing device 120 can be above ground. The peripheral device 110 is in electronic communication with the processing device 120 through the communication channel 150. In operation, the peripheral device 110 generates and transmits data to the processing device 120 through the communication channel 150 and the processing device 120 receives and processes the data.

The peripheral device 110 can be any electronic device that generates and transmits data, such as a sensor. For example, the peripheral device 110 may be a temperature sensor, voltage meter, or current meter. The peripheral device 110 can transmit the data in various ways, including, for example, as periodic digitized measurements, a data stream of samples of a continuous waveform, or a data frame representing a set of collected samples. The processing device 120 can be any electronic device that receives and processes data, such as, a computer or computing device.

The communication channel 150 can by any suitable signal transmission medium or data connection, such as a transmission line(s), optical fiber or fibers, wireless channel, acoustic channel, or any combination thereof. The communication channel 150 may be a full-duplex channel, permitting simultaneous two-way communication, or a half-duplex system, permitting communication in only one direction at a time.

The peripheral device 110 includes a quantizer 112 and a peripheral clock 114. In operation, the peripheral clock 114 generates a clock signal and provides the clock signal to the quantizer 112. The quantizer 112 receives an input signal, such as an analog time varying signal, and generates a quantized signal based on the analog time varying signal and the clock signal. For example, the quantizer 112 may receive an analog signal, sample the analog signal at the frequency of the clock signal, and generate a quantized digital signal representing the sampled information. As a more specific example, the quantizer 112 may be a modulator that can sample the input signal at the frequency of the clock signal and encode the sampled information into a carrier signal. The modulator can perform various types of modulation by varying various properties of a carrier signal to represent the information contained in the analog signal. In some examples, the analog signal can be converted to a digital signal (e.g., using an analog to digital converter) prior to being received by the modulator. The modulator can then modulate a carrier signal by encoding the digital signal into the carrier signal.

The processing device 120 includes a decoder 122 and a processor clock 124. In operation, the processor clock 124 generates a clock signal and provides the clock signal to the decoder 122. The processor clock 124 is synchronized to peripheral clock 114 so that the clock signal generated by the processor clock 124 is synchronized with the clock signal generated by the peripheral clock 114. For example, the frequency of the processor clock signal can be synchronized with the frequency of the peripheral clock signal. The processor clock 124 can be synchronized with the peripheral clock 114 in various ways. In some cases, the peripheral device 110 can transmit the peripheral clock signal to the processing device 120, or the processing device 120 can transmit the processor clock signal to the peripheral device 110. In other cases, the processing device 120 may employ various clock recovery techniques to regenerate the peripheral clock signal at the processing device 120 using timing information from the quantized signals received from the peripheral device 110. However, clock recovery techniques are typically complex to implement and often lack sufficient robustness. For example, clock recovery can require long acquisition times, and cycle slips, or loss of lock condition can nevertheless occur.

In operation, the decoder 122 receives the quantized signal transmitted from the peripheral device 110 through the communication channel 150. The decoder 122 decodes the received signal based on the clock signal of the processor clock 124. For example, the decoder 122 can sample the received signal at the frequency of the clock signal to decode the information encoded in the received signal. In some examples, the decoder 122 can be a demodulator that performs a type of demodulation that corresponds to the modulation performed by the quantizer 112. Since the processor clock 124 is synchronized with the peripheral clock 114, the decoder 122 can sample the input signal at the same frequency as it was quantized by the quantizer 112 so that decoded data corresponds to the data quantized by the quantizer 112. Once the data is decoded, the processing device 120 can then process the data in various ways using other components (not shown). For example, the data may represent a set of sensor measurements or a segment of a time sampled waveform. The processing device 120 may process the data to extract patterns or trends in the data, such as temperature variation detected by the peripheral device 110. As another example, the data may be used (with or without additional processing) for system control purposes, or for displaying parameters to a user.

Various environmental conditions can interfere with the data signals transmitted across the communication channel 150, depending on the implementation setting of the communication system 100A. For example, high electromagnetic interference can introduce noise to the data signals, degrade/distort the data signals, or otherwise interfere with signal integrity. As a result, the data decoded by the decoder 122 may not correspond to the data encoded by the quantizer 112.

Furthermore, it may be difficult to transmit the peripheral clock signal to the processing device 120, or the processor clock signal to the peripheral device 110, to perform clock synchronization. Additionally, it may not be economical to run additional communication channels for this purpose, or to use more complex encoding techniques.

For example, an additional communication channel can be provided to transmit the peripheral clock signal to the processing device 120. However, clock synchronization with such methods typically involves full clock recovery, phase locking, and/or digital interpolation at the processing device 120. Alternatively, an additional communication channel can be provided to transmit the processor clock signal to the peripheral device 110. However, clock synchronization with such methods still involves phase locking at the processing device 120 because the communication delay over the length of the communication channel is unknown, in addition to locking at the peripheral device 110 for coherent transmission of the data signal.

Furthermore, the communication channel signal can be encoded and/or modulated to transmit multiple independent signals over a single communication channel. For example, different wavelengths can be used for each independent signal (e.g., a first wavelength for the clock signal and a second wavelength for the data signal). However, such methods involve combining and splitting signals at both the peripheral device 110 and the processing device 120 and require more expensive quantizers 112, decoders 122, and/or communication channel 150. Accordingly, it may be difficult or not economical to communicate data across the communication channel 150 using the illustrated synchronous communication system 100A.

Figure 1B:
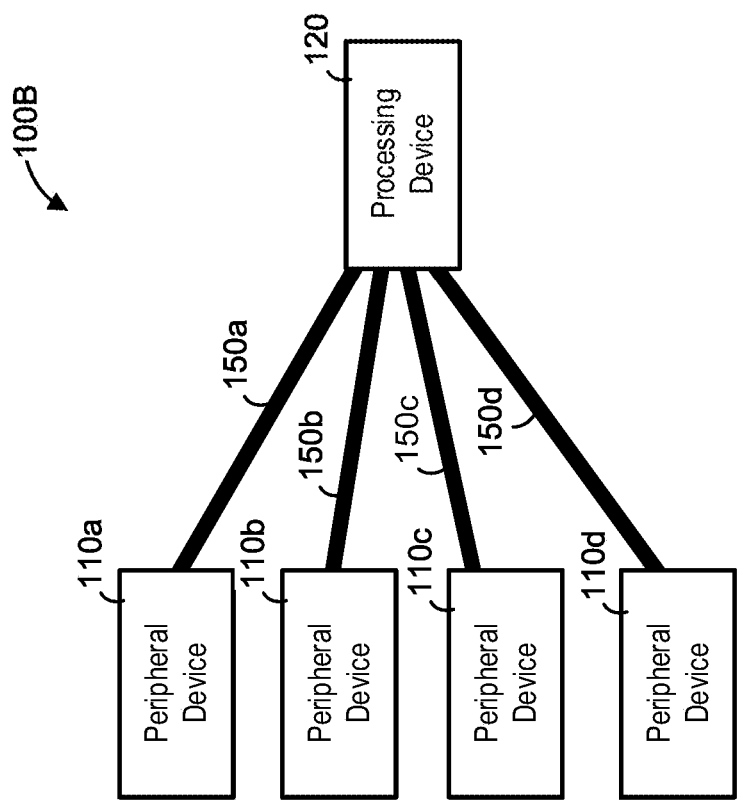
FIG. 1B is a block diagram of another example system for synchronous data communication.

Referring to FIG. 1B, there is shown another example system 100B for synchronous data communication. As shown, communication system 100B also includes a processing device 120. However, in contrast to communication system 110A, communication system 100B includes a plurality of peripheral devices 110a, 110b, 110c, and 110d (collectively referred to as peripheral devices 110a-d). Although four peripheral devices 110a-110d are shown, communication system 110B can include fewer or more peripheral devices. Each peripheral device 110a-d is positioned remote from the processing device 120 so that each peripheral device 110a-d is physically separated from the processing device 120. Each peripheral device 110 is in electronic communication with the processing device 120 through a respective communication channel 150a, 150b, 150c, and 150d (collectively referred to as communication channels 150a-d). In operation, each peripheral device 110a-d generates and transmits data to the processing device 120 through the respective communication channel 150a-d and the processing device 120 receives and processes all of the data.

As described herein, each peripheral device 110a-d can generate a clock signal, quantize an analog time varying signal into a quantized signal based on the clock signal, and transmit the quantized signal to processing device 120. However, each peripheral clock may not be synchronized within the plurality of peripheral devices 110a-d. For example, small variations in the internal timing electronics of each peripheral device 110a-d may result in asynchronous clocks. At the same time, the clock of the processing device 120 cannot be simultaneously synchronized to more than one asynchronous clock. As a result, the processing device 120 may need to buffer and interpolate some of the quantized signals received from the peripheral devices 110a-d so that the signals can be sampled with respect to the common processor clock 224. In this manner, the processing device 120 can correlate asynchronous data signals received from the peripheral devices 110a-d. However, in order to do so, the processing device 120 may require additional processing resources to sample, buffer, interpolate, and resample the various data signals, such as multiple clock recovery and interpolation circuits. Such additional processing can become unwieldy when multiple peripheral devices 110a-d transmit data to the same processing device 120. For example, if additional communication channels 150a-d are provided to transmit the peripheral clock signal from each peripheral device 110a-d to the processing device 120, the total amount of processing dedicated to clock synchronization at the processing device 120 can be burdensome.

Figure 2:
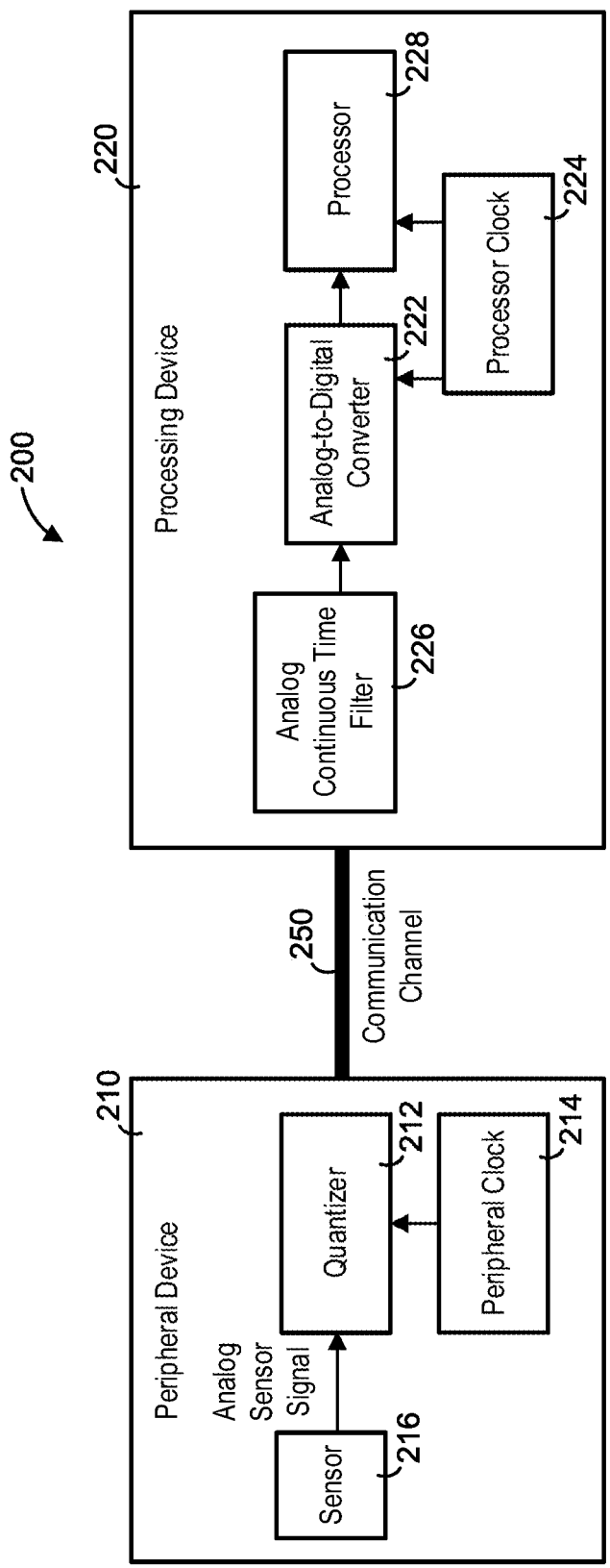
FIG. 2 is a block diagram of an example system for asynchronous data communication in noisy environments, in accordance with an embodiment.

Referring to FIG. 2, there is shown an example system 200 for asynchronous data communication in a noisy environment. Communication system 200 may address at least some of the aforementioned drawbacks of the synchronous communication systems 100A and 100B described herein. As shown, the communication system 200 includes a peripheral device 210 and a processing device 220. The peripheral device 210 is positioned remote from the processing device 220 so that the peripheral device 210 is physically separated from the processing device 220. In some cases, the processing device 220 may be separated from the peripheral device 210 by a relatively large distance. For example, the processing device 220 may be separated from the peripheral device 210 by at least one kilometer. In some cases, the peripheral device 210 may be located underground and the processing device 220 may be located aboveground.

The peripheral device 210 is in electronic communication with the processing device 220 through the communication channel 250. In operation, the peripheral device 210 generates and transmits data to the processing device 220 through the communication channel 250 and the processing device 220 receives and processes the data. In some embodiments, there can be more than one peripheral device 210 in electronic communication with the processing device 220 through a respective communication channel 250, and each peripheral device 210 can be positioned remote from the processing device 220. Each communication channel 250 can couple at least one peripheral device 210 to the processing device 220. Each peripheral device 210 may be coupled to the processing device 220 through a separate communication channel 250. Alternatively, two or more peripheral devices 210 can be coupled to the processing device 220 through a common communication channel 250.

Peripheral device 210 can be any device that generates and transmits data. For example, the peripheral device 210 can include sensor 216. Sensor 216 can be any device that detects events or changes in its environment. For example, the sensor 216 may be a temperature sensor, pressure sensor, position sensor, voltage sensor, current sensor, power sensor, frequency sensor, acoustic sensor, video sensor, accelerometer, or any combination thereof. As a more specific example, the sensor 216 may be a biased diode for sensing temperature, where the voltage across the diode is converted into a continuous bit sequence corresponding to the voltage by the quantizer 212. As another example, the sensor 216 may be a charge-coupled device (CCD) imager where the output analog signal is a sampled voltage that is converted into a bit sequence by the quantizer 212. As a further example, the sensor 216 may be a microphone that generates a continuously varying output voltage that is amplified and then converted into a bit sequence by the quantizer 212. In some embodiments, the peripheral device 210 can be any peripheral device that generates and transmits data.

The peripheral device 210 includes a quantizer 212 and a peripheral clock 214. In operation, the peripheral device 210 converts an analog time varying signal into a quantized signal based on the clock signal of the peripheral clock 214. For example, the quantizer 212 can sample the analog signal at the frequency of the peripheral clock 214 and generate a quantized signal representing the analog signal. In some cases, the analog time varying signal can be an analog sensor signal generated by the sensor 216 that represents one or more environmental conditions measured by the sensor 216. Preferably, the frequency of the peripheral clock signal is greater than the signal bandwidth of the analog signal so that the quantizer can adequately sample the analog signal. For example, the frequency of the peripheral clock signal may be greater than the Nyquist rate of the analog signal. The quantized signal is then transmitted to the processing device 220 through the communication channel 250.

It should be understood that the term Nyquist rate is used herein to refer to a rate that corresponds to the reciprocal of the nominal bandwidth of the analog time varying signal. The nominal bandwidth of the analog time varying signal refers a bandwidth that contains the bulk of the spectral content of the signal.

Preferably, the quantized signal includes at least two discrete amplitude levels. In some cases, the quantized signal has two discrete amplitude levels. For example, the quantized signal may be a 1-bit digital data stream. In various embodiments, the quantizer 212 may be a delta sigma modulator. Preferably, the delta sigma modulator is a second-order delta sigma modulator, as this provides sufficient suppression of the quantization noise involved in the digitization of the input analog signal. However, a first-order delta sigma modulator can also be used. There are other variants of a sigma delta modulator that may be applicable for other sensor applications. For example, a bandpass sigma delta modulator can be used if the sensor 216 generates a bandpass signal as opposed to a baseband signal. In some cases, the quantizer 212 may be a difference modulator.

Preferably, the quantizer 212 is a single bit quantizer. Typically, the communication channel 250 is an optical fiber where OOK (on-off keying) (i.e., where a signal amplitude of zero represents a 0 bit, and a non-zero signal amplitude represents a 1 bit) is used. The communication channel signal 250 may also use BPSK (binary phase-shift keying) signal modulation encoded by the bit sequence of the quantizer 212. Although single bit quantization is preferred, it should be understood that the output of the quantizer 212 can be multi-level, in some embodiments. That is, instead of being limited to the binary levels of '0' and '1' (as for OOK), the modulation may have M levels (i.e., M being a natural number) as a "M-ary" modulation. Furthermore, the modulation on the communication channel 250 can be a bandpass signal and is not limited to baseband modulation, for example, by using frequency translation components in the peripheral device 210 and the processing device 220. In this manner, the communication channel 250 can be a wireless channel or a transmission line.

In various embodiments, the short-term average of the quantized signal can have a 'one-to-one' correspondence to the short-term average of the analog time varying signal. The short-term average of the analog time varying signal can relate to the time constant of the analog time varying signal and/or the inverse bandwidth of the analog time varying signal. In this way, the filter 226 in the processing device 200 can decode or demodulate the quantized signal without clock synchronization.

The communication channel 250 can be any suitable signal transmission medium or data connection for transporting quantized signals from a peripheral device 210 to a processing device 220. For example, the communication channel 250 may include one or more optical communication channels, one or more coaxial transmission lines, and/or one or more wireless communication channels. Preferably, the communication channel 250 is a half-duplex optical link that permits robust communication in environments having high electromagnetic interference or other signal integrity risks. In various embodiments, the communication channel 250 can be a binary signal channel having only two states, such as, on-off keying in an optical fiber. In this manner, the effect of noise or other inference on the data signal can be minimized because small discrepancies in the data signal can easily be distinguished from the binary state representations.

The processing device 220 includes an analog continuous time filter 226, an analog-to-digital converter 222, a processor 228, and a processor clock 224. As shown, the processor clock 224 generates a clock signal and provides the clock signal to the analog-to-digital converter 222 and the processor 228. Each of these components can be implemented as separate components, dedicated integrated circuits, using a FPGA (field programmable gate array), or in a combination. The processor clock 224 is not synchronized with the peripheral clock 214. That is, the processor clock signal is asynchronous with the peripheral clock signal. As a result, simpler and lower cost electronics can be used to implement the processor clock 224 and the peripheral clock 214. For example, the peripheral clock 214 may be a low-cost RC (resistor-capacitor) clock that is incorporated into a single integrated circuit with the quantizer 212. It should be understood that when there is more than one peripheral device 210, the processor clock 224 (and corresponding processor clock signal) can be asynchronous with one or more of the peripheral clocks 214 (and corresponding peripheral clock signal). Likewise, each peripheral clock 214 (and corresponding peripheral clock signal) may be asynchronous with each other peripheral clock 214 (and corresponding peripheral clock signal). In some cases, the processor clock 224 (and corresponding processor clock signal) may be asynchronous with each peripheral clock 214 (and the corresponding peripheral clock signal). In various embodiments, the frequency of each peripheral clock signal is greater than the frequency of the processor clock signal.

It should be understood that reference to a clock or signal being asynchronous with another clock or signal relates to the phase of respective clocks or signals being asynchronous. However, such asynchronism is not deterministic. For example, if two clocks or signals are derived from a common reference (such as GPS or a timing structure in the time varying signal) then the clocks or signals are still referred to being asynchronous.

In operation, the processing device 220 receives one or more quantized signals from the peripheral device 210 through the communication channel 250 and the analog continuous time filter 226 filters the quantized signals. The analog continuous time filter 226 can remove noise from the signals by attenuating frequencies outside the filter bandwidth. The analog continuous time filter 226 can have a bandwidth that corresponds to the signal bandwidth of the analog signals represented by the quantized signals. For example, the filter bandwidth may be narrow relative to the sampling frequency of the quantizer 212. In other words, the filter bandwidth may be less than the frequency of the peripheral clock signal. As a result, the analog continuous time filter 226 can prevent signal aliasing at the analog-to-digital converter 222. Preferably, the analog continuous time filter 226 has a bandwidth that is greater than or equal to the Nyquist rate of the quantized signals generated by the peripheral device 210. For example, the analog continuous time filter 226 may be a low pass filter that filters the applicable frequencies. However, in other embodiments, the analog continuous time filter 226 may be a bandpass filter, for example, when Manchester or Reed Solomon coding is used to quantize the analog signals. Unlike a digital filter, the analog continuous time filter 226 does not require synchronization with the processor clock 224.

The filtered signals are then sampled by the analog-to-digital converter 222 based on the clock signal of the processor clock 224. The resulting converted signals represent an interpolation of the analog signals that is synchronized with the processor clock signal. In various embodiments, the analog-to-digital converter 222 can sample the filtered signal at a rate greater than or equal to the filter bandwidth of the analog continuous time filter 226. In other words, the frequency of the processor clock 224 can be greater than or equal to the filter bandwidth. As a result, the analog-to-digital converter 222 can sample the filtered signals at a frequency corresponding to at least the Nyquist rate of the filtered signal. Since the Nyquist rate corresponds to twice the highest frequency of the signal, the sampling rate of the analog-to-digital converter 222 can generally correspond to the bandwidth of the analog continuous time filter 226. The analog-to-digital converter 222 can have a lower sampling rate as compared to the quantizer 212. In other words, the frequency of the peripheral clock signal can be greater than the frequency of the processor clock signal.

In this configuration, the analog continuous time filter 226 and the analog-to-digital converter 222 effectively resynchronizes the data represented by the analog signal from the peripheral clock 214 to the processor clock 224. This also effectively interpolates the samples to the processor clock 224, regardless of the frequency of the peripheral clock 214. Signal aliasing is also prevented because the bandwidth of the analog continuous time filter 226 corresponds to the analog-to-digital converter 222 sampling rate. Accordingly, the combination of the analog continuous time filter 226 and the analog-to-digital converter 222 can eliminate the need for clock recovery and sample interpolation circuits in the processing device 220, despite the processor clock 224 being asynchronous to the peripheral clock 214. Furthermore, when there is more than one peripheral device 210 (not shown), the processing device 220 can sample and process data signals from each peripheral device 210 using a common processor clock 224 that is asynchronous to each peripheral clock 214, without buffering or resampling. In this manner, the complexity of the processing device 220 can be reduced. Furthermore, unlike conventional clock synchronization, there is no acquisition time required and there is no chance of cycle slips or a loss of lock condition.

In general, the output of the quantizer 212 has a lower frequency spectrum that corresponds to the spectrum of the analog signal. The spectral correspondence is invariant to changes in the frequency of the peripheral clock 214. Because the analog continuous time filter 226 can be assumed to be linear and time invariant, the filter output can be a good approximation of the original analog signal, independent of the frequency of the peripheral clock 214. The analog-to-digital converter 222 can therefore sample the output of the filter 226 at an arbitrary sampling rate. However, by using the processor clock 224, the sampling of the signal can be synchronized with the clock timing of the processing device 220.

When the analog sensor output of the sensor 216 is at the voltage range limit of the quantizer 212, a continuous stream of all zeroes or all ones will be transmitted across the communication channel 250. Hence, the signal on the communication channel 250 does not contain any information regarding the peripheral clock 214. However, the filter 226 and analog-to-digital converter 222 can nevertheless effectively sample the signal at a rate synchronous with the processor clock 224.

The processor 228 then processes the converted signals generated by the analog-to-digital converter 222 to extract the data represented by the analog signal. For example, the data may be sensor data generated by the sensor 216, and the processor 228 may process the converted signals to evaluate one or more environmental conditions measured by the sensor 216. The processor 228 can further process the data in various ways. For example, the data may correspond to time-varying temperatures measured by the peripheral device 210. The processor 228 may log the temperatures or detect if the temperatures are outside of a desired range. The processor 228 may identify correlations or otherwise recognize patterns in the data. The processor 228 may also transform, rescale, filter, or shape the data, for example, by performing perform Fourier processing.

Figure 3:
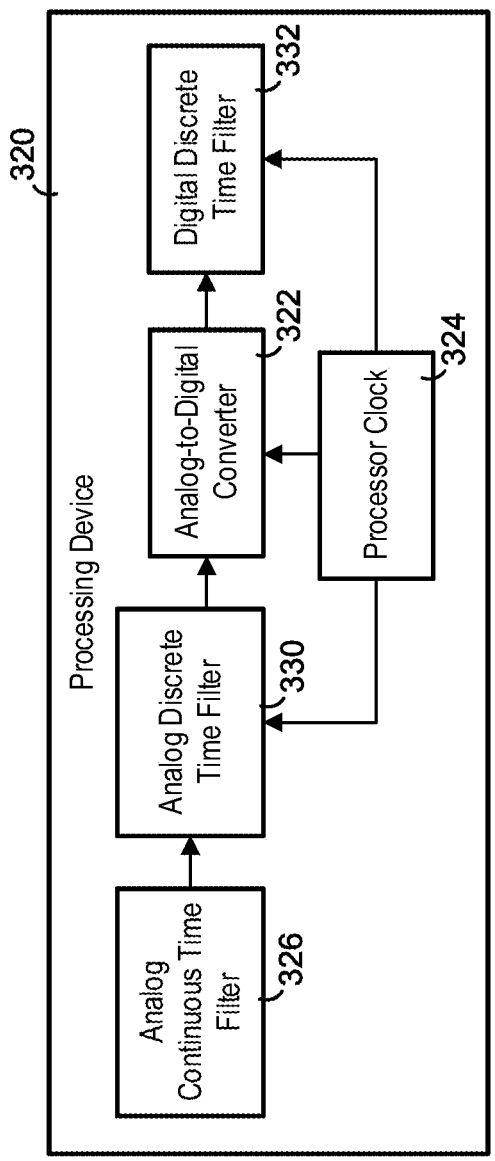
FIG. 3 is a block diagram of another example processing device for the communication system shown in FIG. 2, in accordance with an embodiment.

Referring to FIG. 3, there is shown another example processing device 320 for the communication system 200. As shown, the processing device 320 further includes an analog discrete time filter 330 and a digital discrete time filter 332. The analog discrete time filter 330 samples filtered signals from the analog continuous time filter 326 based on the clock signal from the processor clock 324. The analog continuous time filter 326 reduces the bandwidth of the filtered signals so that it corresponds to the sampling frequency of the analog discrete time filter 330 and the analog-to-digital converter 322. The digital discrete time filter 332 processes the digital samples from the analog-to-digital converter 322 based on the clock signal from the processor clock 324. The digital discrete time filter 332 can help to further reduce noise. For example, when tracking slow temperature variations measured by a noisy peripheral device 210, the digital discrete time filter 332 can have a low pass frequency response commensurate with the slow temperature variations that need to be quantified and observed. It should be appreciated that various other filtering configurations can be implemented in the processing devices 220 and 320 to remove noise and reduce the bandwidth of the data signals to prevent signal aliasing.

Figure 4:
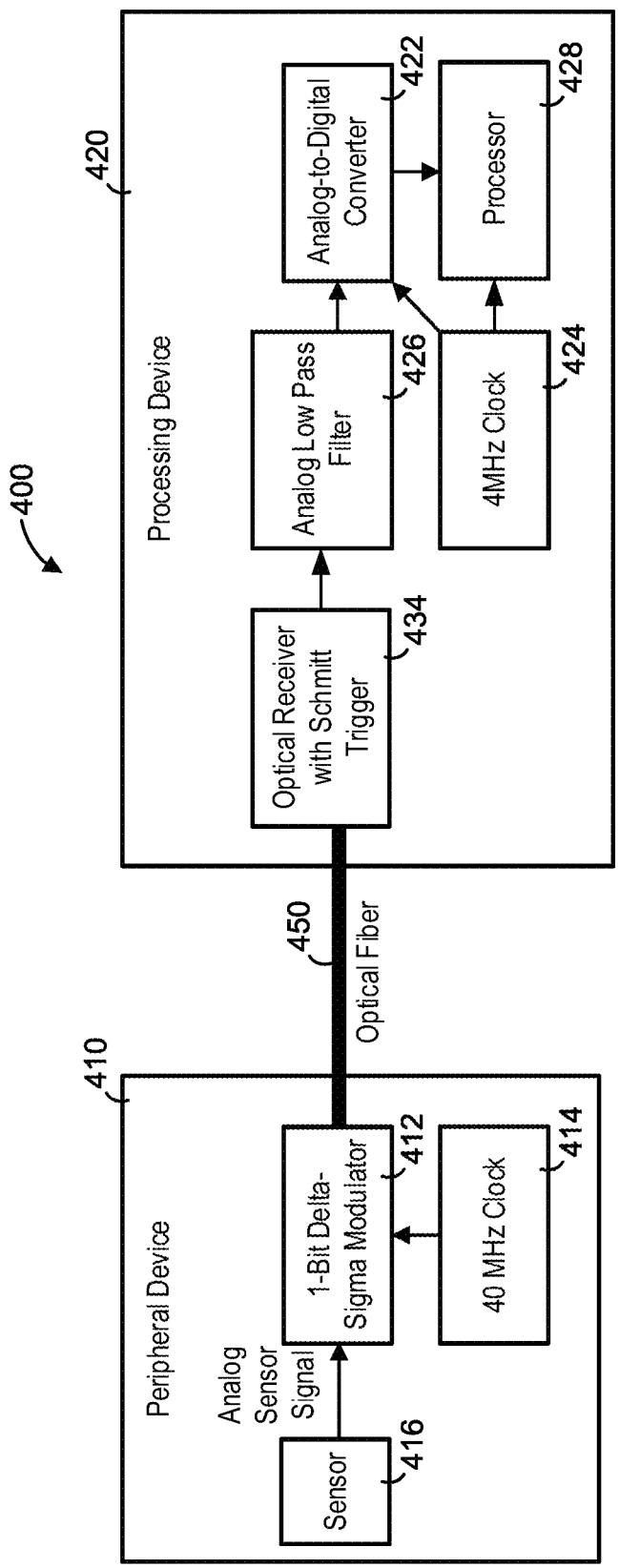
FIG. 4 is a block diagram of another example system for asynchronous data communication in noisy environments, in accordance with an embodiment.

Referring to FIG. 4, there is shown another example system 400 for asynchronous data communication in a noisy environment. Communication system 400 may also address at least some of the aforementioned drawbacks of the synchronous communication systems 100A and 100B described herein. As shown, the communication system 400 includes a peripheral device 410 that is positioned remote from and is in electronic communication with a processing device 420 through an optical fiber channel 450. In various embodiments, there can be more than one peripheral device 410 in electronic communication with the processing device 420 through a respective optical fiber channel 450. Furthermore, although communication system 400 is shown as having an optical fiber communication channel 450, other types of communication channels can be used.

As shown, the peripheral device 410 can include a sensor 416, a 1-bit delta sigma modulator 412 and a 40 MHz peripheral clock 414, and the processing device 420 includes an optical receiver 434, an analog low pass filter 426, an analog-to-digital converter 422, a processor 428, and a 4 MHz processor clock 424. In various embodiments, the processor 428 can be an FPGA (field programmable gate array) that can control the processor clock 424 to adjust the sampling rate of the analog-to-digital converter 422 and processor 428.

In operation, the sensor 416 generates analog sensor signals having a signal bandwidth of about several hundred kHz, and the sensor signals are sampled by the delta sigma modulator 412 at 40 MHz. The delta sigma modulator 412 oversamples the analog sensor signal to provide greater noise suppression. In various embodiments, the oversampling ratio is about 100. The modulated signals are transmitted to the processing device 420 across the optical fiber channel 450. The processing device 420 receives the modulated signal at the optical receiver 434. As shown, the optical receiver 434 can include a Schmitt trigger, which can "square up" the received signal by removing edge jitter and additive high frequency noise associated with the edge. The analog low pass filter 426 reduces the bandwidth and further removes noise from the signal. The analog-to-digital converter 422 then samples the filtered signal at 4 MHz, and the processor 428 processes the digital samples from the analog-to-digital converter 422.

Figure 5:
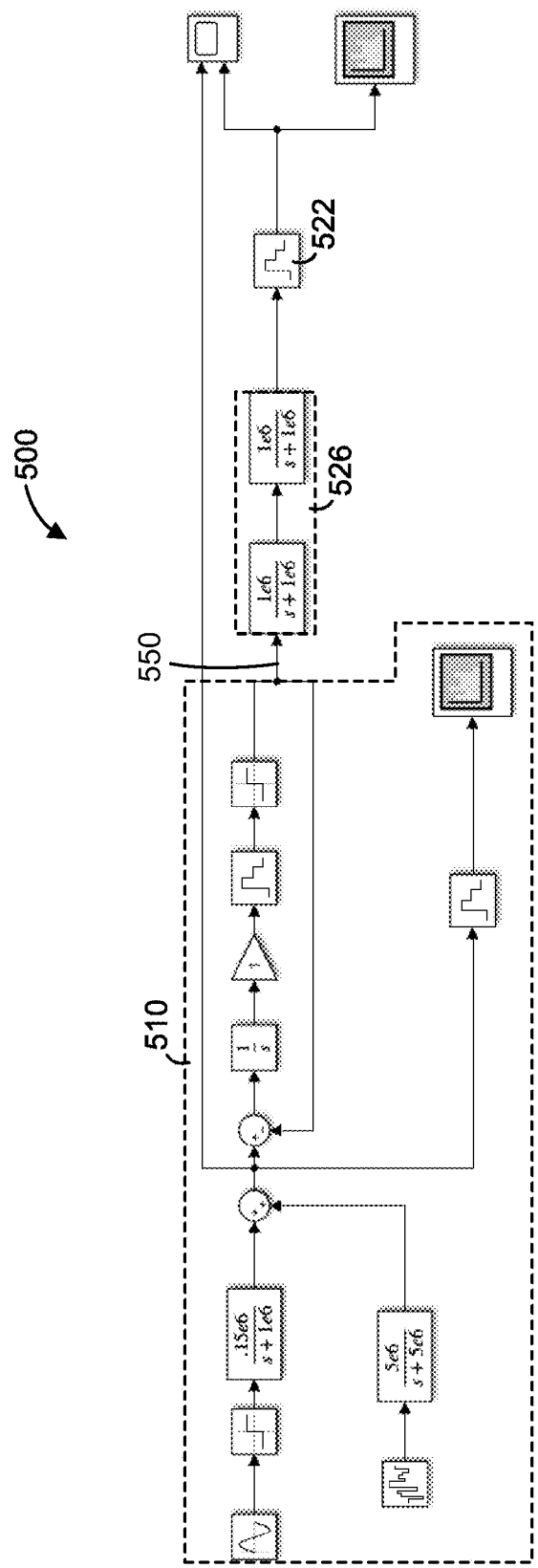
FIG. 5 is a schematic diagram of an example model of an asynchronous data communication system, in accordance with an embodiment.

Referring to FIG. 5, there is shown an example model 500 of a system for asynchronous data communication in a noisy environment. As shown, the example model 500 includes a Simulink® representation of a sensor 510, communication channel 550, analog low pass filter 526, and analog-to-digital converter 522. In the illustrated example, sensor 510 includes a first-order delta sigma modulator, and the analog low pass filter includes two first-order RC (resistor-capacitor) filter sections.

Figure 6A:
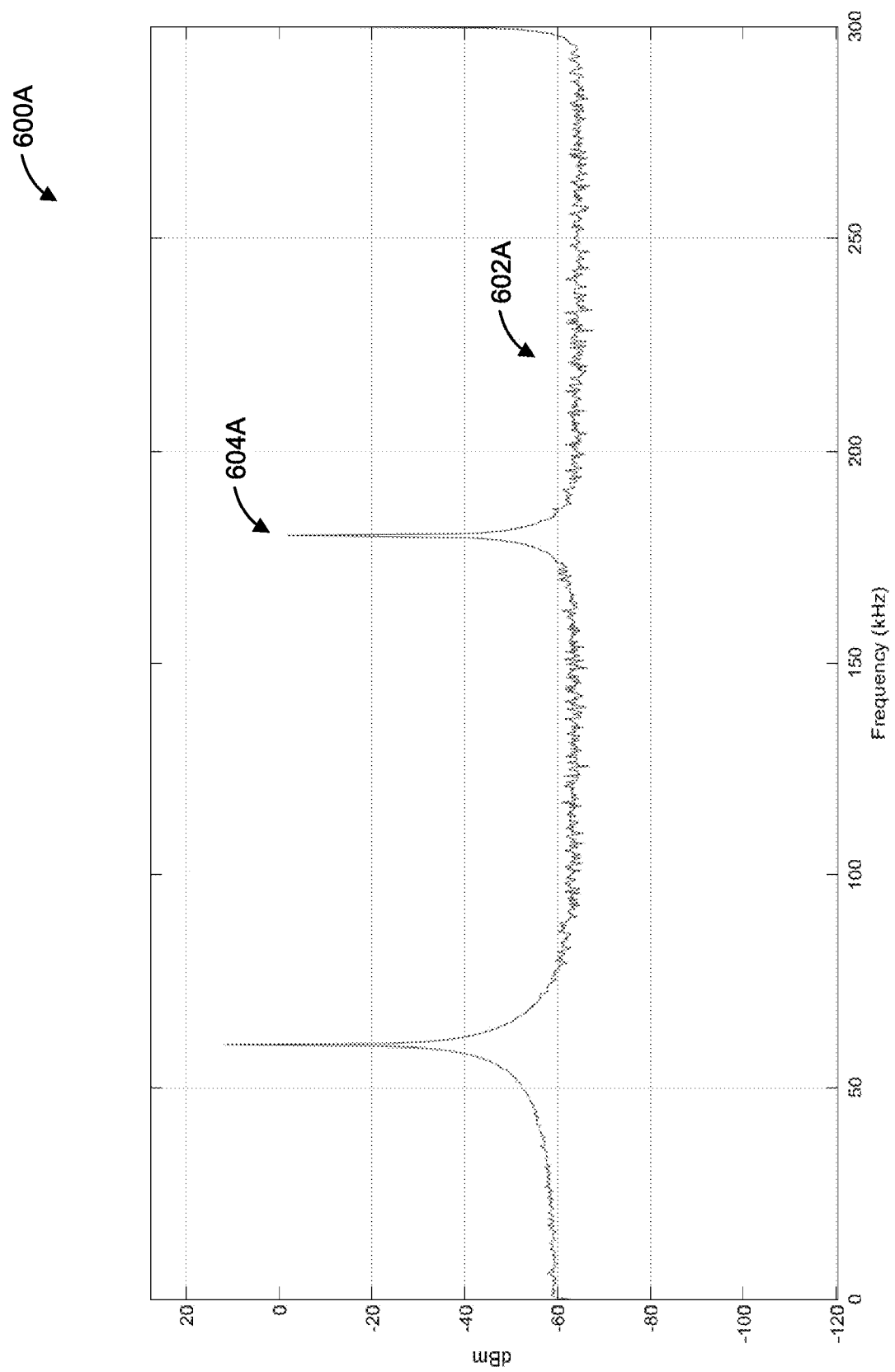
FIG. 6A is a graph of the power spectrum of an input data signal simulated using the model shown in FIG. 5.
Figure 6B:
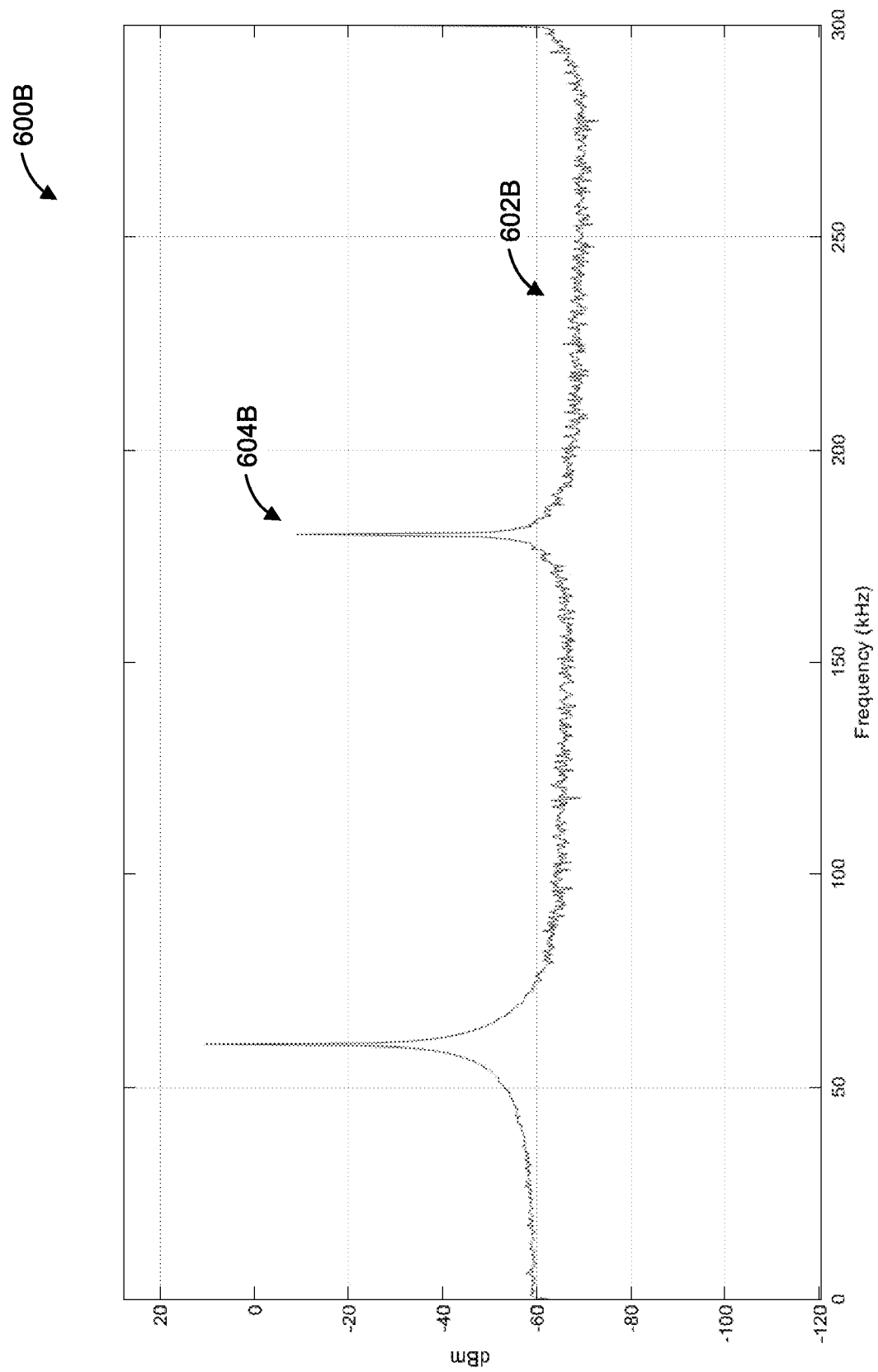
FIG. 6B is a graph of the power spectrum of an output data signal simulated using the model shown in FIG. 5.

Referring to FIGS. 6A and 6B, there is shown graphs 600A and 600B of power spectrums simulated using model 500. More specifically, graph 600A shows the power spectrum of an input data signal (i.e., as generated by the sensor 510), and graph 600B shows the power spectrum of an output data signal (i.e., as sampled the analog-to-digital converter 522). The input data signal is a square wave superimposed with additive bandlimited noise. As shown, the power spectrum of the input data signal shown in graph 600A is nearly identical to the power spectrum of the output data signal shown in graph 600B. This demonstrates that there is almost no discernable signal loss caused by the modulation and demodulation scheme. However, it should be noted that the analog low pass filter 526 has reduced the amplitude of noise at higher frequencies at 602B as compared to at 602A. Furthermore, there is a reduction of the third harmonic at 604B as compared to at 604A. Only odd harmonics appear in the power spectrums because the input data signal is predominantly a square wave.

Figure 7:
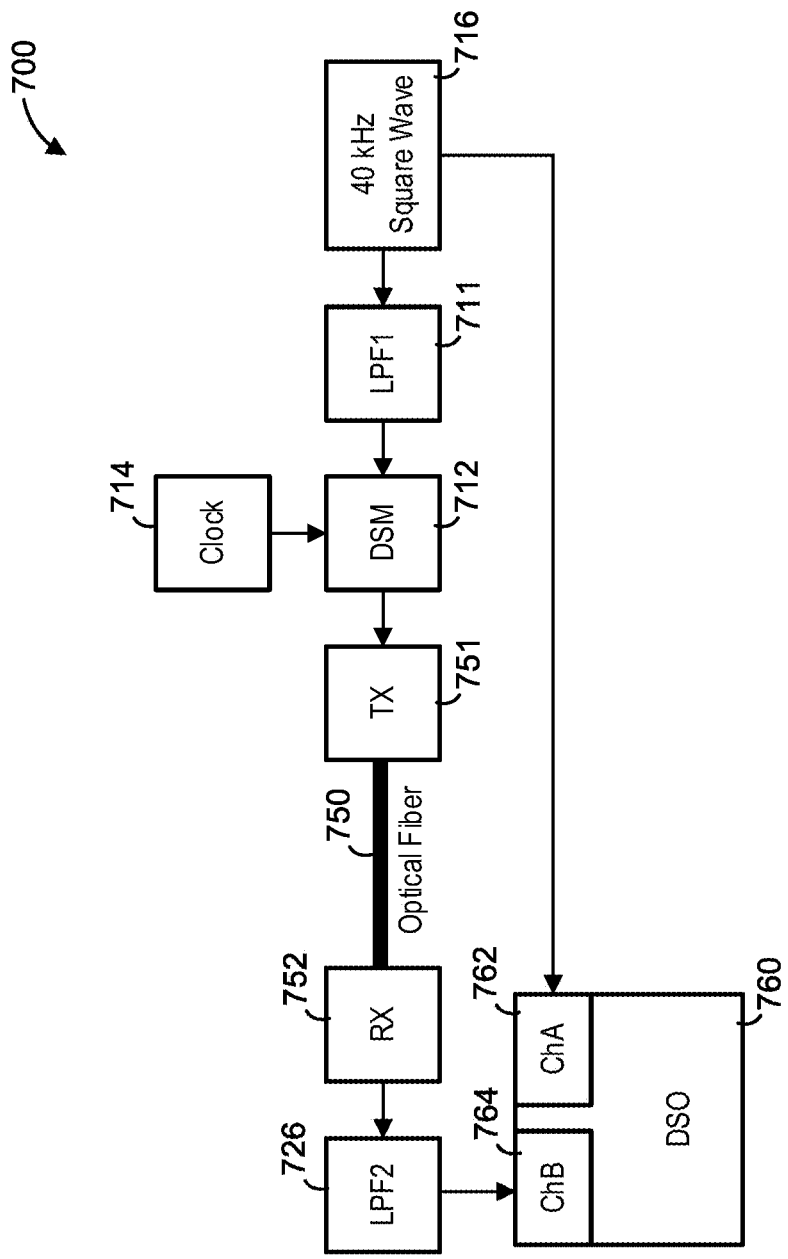
FIG. 7 is a block diagram of an example experimental hardware implementation of a system for asynchronous data communication in noisy environments, in accordance with an embodiment.

Referring to FIG. 7, there is shown an example experimental hardware implementation 700 of the asynchronous data communication systems described herein. As shown, a 40 kHz square wave generator 716 is input to channel A (ChA) 762 of a digital sampling scope (DSO) 760 and a low pass filter test circuit (LPF1) 711. LPF1 711 is a first order RC filter with a 3 dB bandwidth of 80 kHz. The output of LPF1 711 provides an analog time varying signal that is input to a second order delta sigma modulator (DSM) 712. DSM 712 is driven by a 16 MHz clock 714, which is greater than the frequency of the output of LPF1 711. The output of DSM 712, that is, the quantized signal, is transmitted into an optical fiber 750 using a fiber optic transmitter (TX) 751. Optical fiber 750 can be, for example, 10 meters of plastic multimodal fiber. The quantized signal propagates from the optical fiber 750 into a fiber optic receiver (RX) 752. The output of RX 752 is input to a low pass filter (LPF2) 726. LPF2 has a bandwidth of 200 kHz, which is less than the frequency of the output of the DSM 712. The output of LPF2 726 is transmitted to channel B (ChB) 764 of DSO 760 with a 50 ohm ($\Omega$) termination.

Figure 8B:
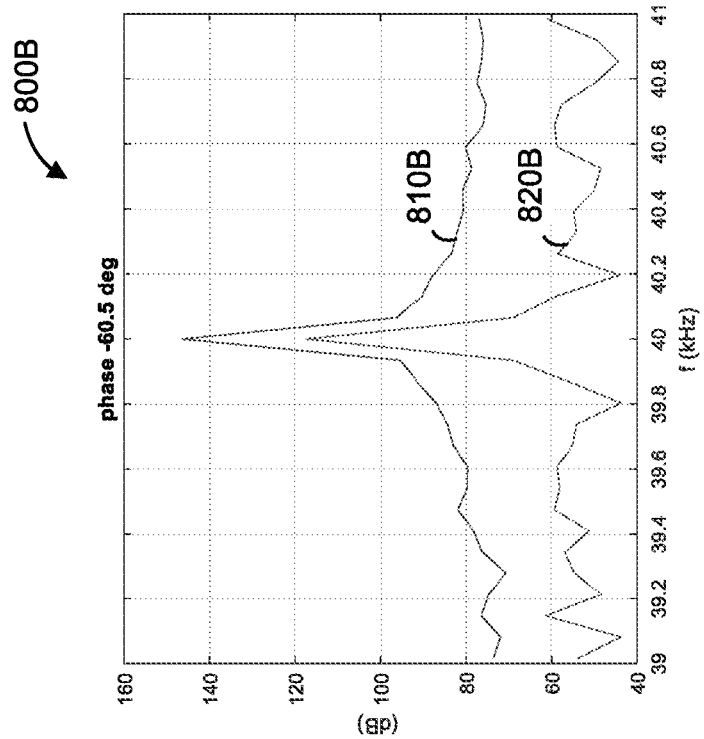
FIG. 8B is another graph of frequency spectrum measurements from the experimental hardware implementation shown in FIG. 7.
Figure 8A:
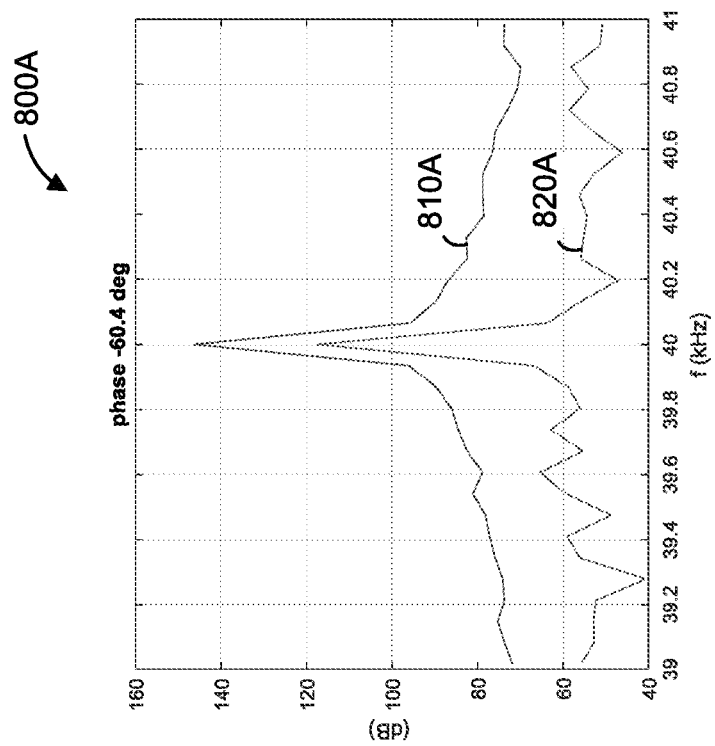
FIG. 8A is a graph of frequency spectrum measurements from the experimental hardware implementation shown in FIG. 7.

Referring to FIGS. 8A and 8B, there is shown graphs 800A and 800B of frequency spectrum measurements from the experimental hardware implementation 700 shown in FIG. 7. Specifically, graphs 800A and 800B show frequency spectrum output measurements 810A, 810B from LPF2 726, and reference spectrum measurements 820A, 820B from the 40 kHz square wave generator 716. The measurements shown in graphs 800A and 800B were taken approximately 10 minutes apart. As shown, there is no measurable drift in the phase of the fundamental output of LPF2 726. Furthermore, no noise from DSM 712 or spectral spurs affecting the output of LPF2 726 were observed.

It will be appreciated that for simplicity and clarity of illustration, where considered appropriate, reference numerals may be repeated among the figures to indicate corresponding or analogous elements. In addition, numerous specific details are set forth in order to provide a thorough understanding of the embodiments described herein. However, it will be understood by those of ordinary skill in the art that the embodiments described herein may be practiced without these specific details. In other instances, well-known methods, procedures and components have not been described in detail so as not to obscure the embodiments described herein. Also, the description is not to be considered as limiting the scope of the embodiments described herein.

It should also be noted that the terms "coupled" or "coupling" as used herein can have several different meanings depending in the context in which these terms are used. For example, the terms coupled or coupling may be used to indicate that an element or device can electrically, optically, or wirelessly send data to another element or device as well as receive data from another element or device. Furthermore, the term "coupled" may indicate that two elements can be directly coupled to one another or coupled to one another through one or more intermediate elements.

It should be noted that terms of degree such as "substantially", "about" and "approximately" as used herein mean a reasonable amount of deviation of the modified term such that the end result is not significantly changed. These terms of degree may also be construed as including a deviation of the modified term if this deviation would not negate the meaning of the term it modifies.

In addition, as used herein, the wording "and/or" is intended to represent an inclusive-or. That is, "X and/or Y" is intended to mean X or Y or both, for example. As a further example, "X, Y, and/or Z" is intended to mean X or Y or Z or any combination thereof.

Furthermore, any recitation of numerical ranges by endpoints herein includes all numbers and fractions subsumed within that range (e.g., 1 to 5 includes 1, 1.5, 2, 2.75, 3, 3.90, 4, and 5). It is also to be understood that all numbers and fractions thereof are presumed to be modified by the term "about" which means a variation of up to a certain amount of the number to which reference is being made if the end result is not significantly changed.

The terms "an embodiment," "embodiment," "embodiments," "the embodiment," "the embodiments," "one or more embodiments," "some embodiments," and "one embodiment" mean "one or more (but not all) embodiments of the present invention(s)," unless expressly specified otherwise.

The terms "including," "comprising" and variations thereof mean "including but not limited to," unless expressly specified otherwise. A listing of items does not imply that any or all of the items are mutually exclusive, unless expressly specified otherwise. The terms "a," "an" and "the" mean "one or more," unless expressly specified otherwise.

The example embodiments of the systems and methods described herein may be implemented as a combination of hardware or software. In some cases, the example embodiments described herein may be implemented, at least in part, by using one or more computer programs, executing on one or more programmable devices comprising at least one processing element, and a data storage element (including volatile memory, non-volatile memory, storage elements, or any combination thereof). Programmable hardware such as FPGA can also be used as standalone or in combination with other devices. These devices may also have at least one input device (e.g., a pushbutton keyboard, mouse, a touchscreen, and the like), and at least one output device (e.g., a display screen, a printer, a wireless radio, and the like) depending on the nature of the device. The devices may also have at least one communication device (e.g., a network interface).

It should also be noted that there may be some elements that are used to implement at least part of one of the embodiments described herein that may be implemented via software that is written in a high-level computer programming language such as object-oriented programming. Accordingly, the program code may be written in C, C++ or any other suitable programming language and may comprise modules or classes, as is known to those skilled in object-oriented programming. Alternatively, or in addition thereto, some of these elements implemented via software may be written in assembly language, machine language or firmware as needed. In either case, the language may be a compiled or interpreted language.

At least some of these software programs may be stored on a storage media (e.g., a computer readable medium such as, but not limited to, ROM, magnetic disk, optical disc) or a device that is readable by a general or special purpose programmable device. The software program code, when read by the programmable device, configures the programmable device to operate in a new, specific and predefined manner in order to perform at least one of the methods described herein.

Furthermore, at least some of the programs associated with the systems and methods of the embodiments described herein may be capable of being distributed in a computer program product comprising a computer readable medium that bears computer usable instructions for one or more processors. The medium may be provided in various forms, including non-transitory forms such as, but not limited to, one or more diskettes, compact disks, tapes, chips, and magnetic and electronic storage.

The present invention has been described here by way of example only, while numerous specific details are set forth herein in order to provide a thorough understanding of the exemplary embodiments described herein. However, it will be understood by those of ordinary skill in the art that these embodiments may, in some cases, be practiced without these specific details. In other instances, well-known methods, procedures and components have not been described in detail so as not to obscure the description of the embodiments. Various modification and variations may be made to these exemplary embodiments without departing from the spirit and scope of the invention, which is limited only by the appended claims.

The invention claimed is:

1. A system for asynchronous communication in noisy environments, the system comprising:
   one or more peripheral devices, each peripheral device comprising:
      a peripheral clock for generating a peripheral clock signal; and
      a quantizer for generating a quantized signal representing an analog time varying signal at the peripheral device by sampling the analog time varying signal based on the peripheral clock signal, the quantized signal comprising at least two discrete amplitude levels;
   a processing device remotely located from each peripheral device, the processing device comprising:
      a processor clock for generating a processor clock signal, the processor clock signal being asynchronous with at least one peripheral clock signal;
      an analog continuous time filter for filtering one or more quantized signals generated by the one or more peripheral devices to generate one or more filtered signals, the analog continuous time filter having a filter bandwidth corresponding to a signal bandwidth of one or more analog time varying signals represented by the one or more quantized signals; and
      an analog-to-digital converter for generating one or more converted signals by sampling the one or more filtered signals based on the processor clock signal, each converted signal representing an interpolation of one of the one or more analog time varying signals that is synchronized with the processor clock signal; and
   one or more communication channels for transporting the one or more quantized signals from the one or more peripheral devices to the processing device, each communication channel coupled between at least one peripheral device of the one or more peripheral devices and the processing device.

2. The system of claim 1, wherein the filter bandwidth of the analog continuous time filter is less than the frequency of each peripheral clock signal.

3. The system of claim 1, wherein the frequency of each peripheral clock signal is greater than the frequency of the processor clock signal.

4. The system of claim 1, wherein the frequency of the processor clock signal is greater than or equal to the filter bandwidth of the analog continuous time filter.

5. The system of claim 1, wherein the filter bandwidth of the analog continuous time filter is greater than or equal to the Nyquist rate of the one or more quantized signals.

6. The system of claim 1, wherein the frequency of the peripheral clock signal is greater than the signal bandwidth of the one or more analog time varying signals.

7. The system of claim 1, wherein:
the one or more peripheral devices comprise a plurality of peripheral devices; and
each peripheral clock of each peripheral device generates a peripheral clock signal that is asynchronous with the processor clock signal.

8. The system of claim 7, wherein each peripheral clock of each peripheral device is asynchronous with each other peripheral clock signal.

9. The system of claim 1, wherein each peripheral device comprises a sensor for generating the analog time varying signal, the analog time varying signal representing one or more environmental conditions measured by the sensor.

10. The system of claim 9, wherein the processing device comprises a processor for processing the one or more converted signals based on the processor clock signal to evaluate the one or more environmental conditions.

11. The system of claim 1, wherein the quantizer is a delta sigma modulator.

12. The system of claim 1, wherein the quantized signal has two discrete amplitude levels.

13. The system of claim 1, wherein the frequency of each peripheral clock signal is greater than the Nyquist rate of the analog time varying data signal.

14. The system of claim 1, wherein the one or more communication channels comprises at least one of: (i) one or more optical communication channels, (ii) one or more coaxial transmission lines, or (iii) one or more wireless communication channels.

15. The system of claim 1, wherein the analog continuous time filter comprises at least one of: (i) a low pass filter, or (ii) a bandpass filter.

16. The system of claim 1, wherein the processing device comprises a digital discrete time filter for filtering the one or more filtered signals.

17. The system of claim 1, wherein the processing device is separated from each peripheral device by at least one kilometer.

18. The system of claim 1, wherein each peripheral device is located underground and the processing device is located aboveground.

19. A method for asynchronous communication in noisy environments between one or more peripheral devices and a processing device remotely located from each peripheral device, the method comprising:
generating, by a quantizer of each peripheral device, a quantized signal representing an analog time varying signal at that peripheral device by sampling the analog time varying signal based on a peripheral clock signal of that peripheral device, the quantized signal comprising at least two discrete amplitude levels;
transmitting one or more quantized signals from the one or more peripheral devices to the processing device through one or more communication channels, each communication channel coupled between at least one peripheral device of the one or more peripheral devices and the processing device;
filtering, by an analog continuous time filter of the processing device, the one or more quantized signals to generate one or more filtered signals, the analog continuous time filter having a filter bandwidth corresponding to a signal bandwidth of one or more analog time varying signals represented by the one or more quantized signals; and
generating, by an analog-to-digital converter of the processing device, one or more converted signals by sampling the one or more filtered signals based on a processor clock signal of the processing device, each converted signal representing an interpolation of one of the one or more analog time varying signals that is synchronized with the processor clock signal, the processor clock signal being asynchronous with at least one peripheral clock signal.

20. The method of claim 19, wherein the filter bandwidth of the analog continuous time filter is less than the frequency of each peripheral clock signal.

* * * * *